(12) United States Patent
Bucht

(10) Patent No.: US 6,392,570 B1
(45) Date of Patent: May 21, 2002

(54) METHOD AND SYSTEM FOR DECODING 8-BIT/10-BIT DATA USING LIMITED WIDTH DECODERS

(75) Inventor: Thomas W. Bucht, Hillsboro, OR (US)

(73) Assignee: Crossroads Systems, Inc., Austin, TX (US)

( * ) Notice: Subject to any disclaimer, the term of this patent is extended or adjusted under 35 U.S.C. 154(b) by 0 days.

(21) Appl. No.: 09/662,075

(22) Filed: Sep. 14, 2000

Related U.S. Application Data

(60) Provisional application No. 60/202,722, filed on May 8, 2000.

(51) Int. Cl.[7] ................................................ H03M 7/00
(52) U.S. Cl. ........................................................ 341/59
(58) Field of Search ..................................... 341/58, 59

(56) References Cited

U.S. PATENT DOCUMENTS

| | | | |
|---|---|---|---|
| 4,486,739 A | 12/1984 | Franaszek et al. ......... 340/347 |
| 5,025,256 A | 6/1991 | Stevens | |
| 5,396,239 A | 3/1995 | McMahon et al. | |
| 5,703,580 A | * 12/1997 | Ko ............................... 341/59 |
| 5,739,779 A | * 4/1998 | Kunisa et al. ................. 341/59 |
| 6,195,764 B1 | * 2/2001 | Caldara et al. ............... 714/30 |
| 6,295,010 B1 | * 9/2001 | Thiesfeld .................... 341/59 |

FOREIGN PATENT DOCUMENTS

GB 2315392 A 1/1998 ............. H04L/5/20

OTHER PUBLICATIONS

Altera® Flex10KE Embedded Programmable Logic Family, Aug. 1999, ver.2.02, pp. 1–59.
International Search Report mailed Nov. 13, 2001, in corresponding PCT Application Ser. No. PCT/US01/14580, 4 pages.

* cited by examiner

*Primary Examiner*—Howard L. Williams
(74) *Attorney, Agent, or Firm*—Gray Cary Ware & Freidenrich, LLP

(57) ABSTRACT

A method and system for decoding 8B/10B data is provided. In one embodiment, the method includes the steps of determining the presence of one of a plurality of predetermined data sequences within a first portion of a data word, translating the predetermined data sequences into representative signals (flags) having a smaller aggregate data width than the first portion of the data word, and providing the representative signals together with remaining portions of the data word to a logic block for decoding. This embodiment of the present method allows the encoded data to be decoded using limited-width decoders, allows first and second portions of each encoded data word to be decoded concurrently, and allows the decoding of the encoded data words to be pipelined to increase the throughput of the decoder.

27 Claims, 1 Drawing Sheet

METHOD AND SYSTEM FOR DECODING 8-BIT/10-BIT DATA USING LIMITED WIDTH DECODERS

This application claims the benefit of the filing date of U.S. Provisional Patent Application Ser. No. 60/202,722 by inventors Tom Bucht, entitled "Method and System for Decoding 8-Bit/10-Bit Data using Limited Width Decoders" filed on May 8, 2000.

TECHNICAL FIELD OF THE INVENTION

The present invention relates generally to electronic devices and more particularly to a method and system for decoding 8-bit/10-bit data in switching circuits using limited-width decoding devices.

BACKGROUND OF THE INVENTION

Many systems, including most Fibre Channel systems, use an 8B/10B encoding scheme. In this scheme, 8-bit data is encoded into 10-bit data before it is transmitted from one device to another. Encoded 10-bit data that is received by a device is decoded to produce the original 8-bit data, which can then be processed normally within the device. 8B/10B encoding is described in U.S. Pat. No. 4,483,739 to IBM issued in 1994 which is incorporated by reference herein.

One of the motivations for using 8B/10B encoding is that it allows certain characteristics of the encoded data to be controlled. For example, the total number of ones and zeros can be made essentially equal, and the number of consecutive ones or zeros can be limited. These characteristics are desirable because the quality of the data signal may degraded as a result of shifts induced by a shifting DC-component. Another motivation behind the use of 8B/10B encoding is the ability to use special code words which would be impossible if no encoding was performed.

Every ten bit code group must fit into one of the following three possibilities: five ones and five zeros; four ones and six zeros; or six ones and four zeros. This requirement helps limit the number of consecutive ones and zeros between any two code groups (10-bit data words) and balances the numbers of ones and zeros.

While the use of 8B/10B encoding maintains the DC component of the data signal at a nearly stationary level, additional DC balancing is achieved through the use of a disparity (or running disparity) calculation. The concept of disparity is used to keep the number of ones in a data signal equal to the number of zeros in that data signal. If the number of ones and the number of zeros are equal, the DC level should remain balanced halfway between the 'one' voltage level and the 'zero' voltage level. Disparity can be either positive or negative. Normally, the disparity is positive if more ones have been transmitted than zeros and negative if more zeros have been transmitted than ones (since the last reset event.)

Certain hardware devices such as programmable logic devices (PLDs) or programmable gate arrays (PGAs), contain logic blocks. Each logic block has a limited number of inputs and outputs. In one instance, the logic blocks may be able to accommodate 8-bit data. In this case, the decoding of 10-bit data obviously cannot be performed by a single logic block because the data is too wide for the logic block. While additional logic blocks can be used, the 10-bit data cannot simply be broken into two smaller blocks that could be independently decoded, then combined to form a decoded 8-bit data word.

The logic blocks would instead have to be cascaded (placed in series with one another) together to create a decoder which is sufficiently large to handle the entire 10-bit data word. Cascading the logic blocks, however, greatly reduces operating speed. For an 8-bit/10-bit decoder, many additional layers of logic are required. Each of these logic layers decreases the operating speed of the decoder.

It should be noted that 8B/10B decoding actually requires an input width of 11 bits (10 data bits plus a current disparity bit.) The decoding process produces an output of 9 bits (8 data bits plus a "K" character indicator.) All 11 bits must be considered when generating the 9 bits of output data.

In designing a device that performs 8B/10B decoding, conventional logic design tools may be used. These tools implement conventional design rules which may lead to the type of cascaded designs described above. The resulting devices typically run so slowly that they do not comprise viable products. In addition to the decrease in speed caused by the cascading of logic blocks, the device designs produced by conventional tools may waste a considerable amount of logic. For example, while a first 8-bit logic block may be fully utilized, a second 8-bit logic block may be used to handle only the 2–3 bits of data that could not be accommodated by the first block. The remaining 5–6 bits are wasted. It is therefore necessary to consider alternative approaches for decoding the 8B/10B data.

There is a need, therefore, for a method and system for providing 8B/10B decoding using the fewer than 11 inputs and 9 outputs per block. There is a need for a method and system to reduce the total number of logic blocks required to implement a decoding between 8 and 10-bit data in a fibre channel switching circuit.

SUMMARY OF THE INVENTION

In accordance with the present invention, a method and system for decoding 8B/10B data with limited width decoders is provided. The disadvantages and problems associated with previously developed decoder methods and systems may be thereby substantially eliminated or reduced.

According to one aspect of the invention, there is provided a method for decoding an 8B/10B-encoded data word using a switching circuit comprising a set of logic devices having data widths that are less than the width of the encoded data word. In one embodiment, the method includes the steps of determining the presence of one of a plurality of predetermined data sequences within a first portion of a data word, translating the predetermined data sequences into representative signals having a smaller aggregate data width than the first portion of the data word, and providing the representative signals together with remaining portions of the data word to a logic block for decoding.

According to another aspect of the invention, there is provided a device for decoding 8B/10-encoded data, wherein the device uses logic blocks that have smaller data widths than the encoded data. In one embodiment, the device includes at least two pipeline stages. In the first pipeline stage, a portion of each encoded data word is pre-decoded to produce one or more flags having an aggregate data width which is less than the width of the pre-decoded portion of the data word. In the second pipeline stage, the remaining portion of the encoded data word is decoded using the one or more flags. The pre-decoded portion of the data word is also decoded in the second pipeline stage.

One advantage of the present invention is that it makes possible a practical 8-bit/10-bit decoder function that includes disparity and K character indicators that may be implemented in a device containing blocks having fewer than 11 inputs and 9 outputs per block.

The present invention can also reduce the speed penalty associated with cascaded layers of logic by taking particular groups of bits of the encoded data and pre-decoding them. The pre-decode function forms a pipeline stage that converts a set of bits from an encoded data word into fewer equivalent bits. Then, in a subsequent pipeline stage, the equivalent bits, combined with the remaining bits of the encoded data word, can be decoded to produce the decoded data word.

BRIEF DESCRIPTION OF THE DRAWINGS

For a more complete understanding of the present invention and the advantages thereof, reference is now made to the following description taken in conjunction with the accompanying drawings in which like reference numerals indicate like features, and further wherein.

Figure 1A:
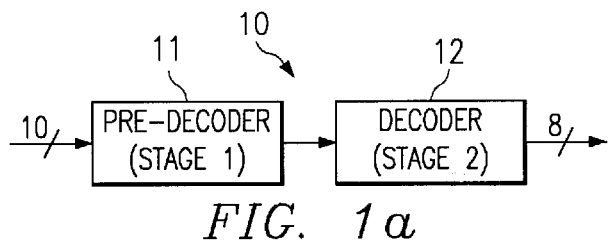
FIG. 1a is a diagram illustrating the decoding of 8B/10B data words in one embodiment of the present system.

While the invention is subject to various modifications and alternative forms, specific embodiments thereof are shown by way of example in the drawings and the accompanying detailed description. It should be understood, however, that the drawings and detailed description are not intended to limit the invention to the particular embodiment which is described. This disclosure is instead intended to cover all modifications, equivalents and alternatives falling within the spirit and scope of the present invention as defined by the appended claims.

DETAILED DESCRIPTION OF THE INVENTION

A preferred embodiment of the invention is described below. It should be noted that this and any other embodiments described below are exemplary and are intended to be illustrative of the invention rather than limiting.

Broadly speaking, the present invention comprises a system and a method for decoding and encoding 8B/10B data in a manner which is more efficient than conventional methods. Generally speaking, the system comprises a pre-decoder which is used in conjunction with an 8B/10B decoder so that the processing (decoding or encoding) of each of the 8B/10B data words can be overlapped with the processing of adjacent data words. In one embodiment, this allows the processing of the 8B/10B data words to be pipelined so that only a single clock cycle is required for decoding of each data word (as compared to two cycles which are required to encode/decode data words in conventional systems.)

Figure 1B:
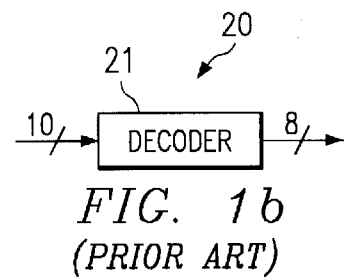
FIG. 1b is a diagram illustrating the decoding of 8B/10B data words in a conventional decoding system.

Referring to FIGS. 1a and 1b, a pair of diagrams illustrating the decoding of 8B/10B data words in one embodiment of the present system and in the prior art are shown. FIG. 1 a show is a block diagram of a system 10 which comprises a pre-decoder 11 and a decoder 12 is shown. The encoded data words are 10 bits wide. These data words are input to pre-decoder 11, which examines the data words to identify predetermined bit patterns within the words. Depending upon whether the predetermined bit patterns are detected, certain signals or flags may be asserted. These signals are transmitted to decoder 12, along with the corresponding data words. The decoder 12 then processes the data words and signals and produces the corresponding decoded 8-bit data words.

Encoded 8B/10B data words can be processed by pre-decoder 11 and decoder 12 in a pipelined fashion. That is, while one data word is being processed by pre-decoder 11, another data words can be processed by decoder 12. If each of these components can perform its respective processing of each data word in a single cycle, the combined components can operate with a throughput of one data word per clock cycle. Each word is pre-decoded in pre-decoder 11 during a particular cycle, then, during the next cycle, the word (along with the corresponding flags) is decoded in decoder 12. While the word is being decoded in decoder 12, a subsequent word can be pre-decoded in pre-decoder 11.

The throughput of the system can be illustrated as a shown below in Table 1a. Table 1a shows the processing of three data words numbered 1, 2 and 3. Each column in Table 1a illustrates a given clock cycle. The clock cycles are labeled "n", "n+1", and so on. As shown in this table, during cycle n, pre-decoder 11 processes data word 1, while decoder 12 is idle (this assumes that there was no data word immediately preceding word 1.) Word 1 is then moved to decoder 12, where it is processed during cycle n+1. As a word 1 is processed by decoder 12, pre-decoder 11 processes word 2. Similarly, while decoder 12 processes word 2 in cycle n+2, pre-decoder 11 processes word 3. Since, in this example, no data follows word 3, pre-decoder 11 is idle while decoder 12 processes word 3. Thus, the throughput of the system is n−1 words per n cycles (which approaches one word per cycle as n increases).

TABLE 1a

|  | n | n + 1 | n + 2 | n + 3 |
| --- | --- | --- | --- | --- |
| Pre-decode | 1 | 2 | 3 | — |
| Decode | — | 1 | 2 | 3 |

For purposes of comparison, be throughput of systems which perform conventional 8B/10B processing is illustrated in Table 1b. Table 1b corresponds to the system shown in FIG. 1b. FIG. 1b illustrates a system 20 which includes a single decoder component 21. The decoder 21 is shown as a single component because all of the operations performed by decoder 21 on a given data word must be completed before operations can be initiated on a subsequent data word. Conventional 8B/10B decoders operate on one portion of a data word at a time. The first portion is decoded using the current running disparity. After the first portion is decoded, the running disparity is updated. This updated running disparity is then used to decode the second portion of the data word and generate the 8-bit decoded word. After the second portion of the data word is decoded, the running disparity is again updated. This twice-updated running disparity can then be used to begin decoding a subsequent data word.

The throughput of conventional 8B/10B systems is illustrated in Table 1b. Conventional systems normally processed each of the two portions of the data word in a single clock cycle. Because the two portions of the data word must be processed consecutively, two clock cycles are therefore required to process a single data word. As shown in Table 1b, if the processing of word 1 begins in cycle n, the decoding of this word is completed after cycle n+1. Word 2 can then be decoded during the next two clock cycles (n+2 and n+3.) Finally, word 3 can be decoded during clock cycles n+4 and n+5. Thus, the decoding of 8B/10B data words proceeds at a rate of one of word per two cycles (0.5 words per cycle,) or half the speed of the present system.

TABLE 1b

| | N | n + 1 | n + 2 | n + 3 | n + 3 | n + 3 |
|---|---|---|---|---|---|---|
| Decode | 1 | 1 | 2 | 2 | 3 | 3 |

The present system takes advantage of the fact that there are patterns in the encoded 8B/10B data that correspond to particular effects in the decoding of the data. For example if certain patterns are detected in the encoded data words, the data which is decoded from them will be the same, regardless of whether the running disparity is positive or negative. Other patterns, when detected, indicate that the decoded data will be valid if the running disparity is positive and invalid if the running disparity is negative. Still other patterns indicate that the decoded data will be valid if the running disparity is negative and invalid if the running disparity is positive.

It may be useful to examine several of the 8B/10B encodings to illustrate these effects. The first of the effects mentioned above is the decoding of the data to produce the same output, regardless of whether the running disparity is positive or negative. For example, if the first six bits are "110001" a valid 6-bit pattern is present. This is true whether the running disparity is positive or negative. By using this validity flag, a decoder needs only five input bits (the flag plus the remaining four bits) to decode bits 7–5 (hgf).

As another example, reference is made to the bit pattern "101101". This 6-bit pattern may or may not be valid, depending upon the running disparity. If the running disparity is negative, this bit pattern is valid. Otherwise it is not. The decoder therefore checks negative running disparity, the validity flag and the remaining four bits. Thus, a total of six input bits are required to decode bits 7–5 (hgf) for the disparity-different characters. Likewise, if the first six bits of the encoded data word are "010010", the bit pattern is valid if the running disparity is positive. The decoder in this case checks positive running disparity, the validity flag and the remaining four bits.

The present system is configured to perform a pre-decoding step in which it detects such patterns in the encoded data and sets corresponding flags. These flags can then be used to decode the data in a subsequent decoding step. Performing the decoding of the 8B/10B data in this manner provides several advantages over conventional decoding. First, the patterns are detected in a 6-bit piece of each encoded data word, so the pre-decoding can be performed using an 8-bit-wide logic block. Further, because the effect of decoding the first six bits of each encoded word is identified by the states of the corresponding flags, the decoding of the remainder of the encoded word can proceed using the flags as inputs instead of the first six bits. This allows the decoding of the encoded data word to be broken into separate parts that can be performed using 8-bit-wide logic blocks. Another closely related advantage is that the decoding of the two different parts of the encoded data words can be performed in parallel rather than in series. Yet another advantage is that, because the pre-decoding step does not depend upon the output of the decoding step, these two steps can be performed in a pipelined fashion, rather than having to complete both steps for a particular encoded data word before proceeding to operate on a subsequent data word.

Figure 2:
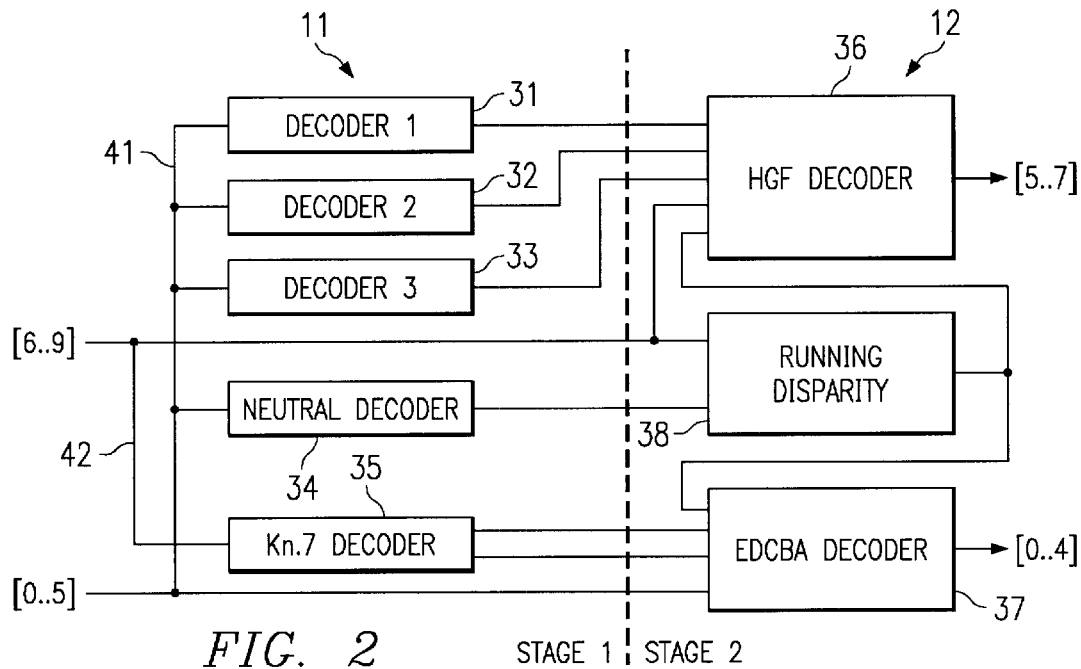
FIG. 2 is a functional block diagram illustrating one embodiment of the present 8B/10B decoding system.

Referring to FIG. 2, a functional block diagram illustrating one embodiment of the present system is shown. The components depicted in this figure are separated by a dashed line that indicates the boundary between a first pipeline stage and a second pipeline stage, the first stage comprising a pre-decoder 11 and the second stage comprising a decoder 12. It should be noted that the system includes a plurality of flip-flops which are located between the two stages and are used to hold the values of the encoded data words (bits [0 . . . 5] and [6 . . . 9]) and the corresponding flags. The flip-flops are commonly employed in pipelined circuits to maintain the appropriate values for use by the logic in each pipeline stage. They are not shown in FIG. 2 in order to maintain the clarity of the diagram.

Pre-decoder 11 comprises a plurality of sub-decoders that generate the flags which will be used to finally decode the indicated data words. These decoders include: a first decoder 31; a second decoder 32; a third decoder 33; a neutral decoder 34; and a Kn.7 decoder 35. The components within pre-decoder 11 and decoder 12 may alternately be referred to as decoders, sub-decoders or flag generators.

First decoder 31, second decoder 32, third decoder 33 and neutral decoder 34 are each coupled to an input line 41 through which a first portion of an encoded data word is received. More specifically, the first six bits of the encoded data word are provided to these decoders. These bits may alternately be referred to as bits [0 . . . 5], or bits abcdei, (where the entire encoded word comprises bits [0 . . . 9], or bits abcdeifghj.) Each of decoders 31–33 processes these six bits and generates a corresponding flag from the bits. Kn.7 decoder 35 is coupled to input line 42, through which a second portion of the encoded data word (comprising bits [6 . . . 9], or fghj) is received.

First decoder 31 is configured to detect patterns in bits [0 . . . 5] which indicate that the decoded data will be valid if the running disparity is positive and invalid if the running disparity is negative. Table 2 shows the values of the flag generated by first decoder 31 corresponding to the various possible sets of input bits. It can be seen from table 2 that all of the patterns for which the corresponding flag is true have two 1's and four 0's.

TABLE 2

| If [0 . . . 5] = | The first flag is: |
|---|---|
| 011000 | true |
| 100010 | |
| 010010 | |
| 001010 | |
| 000110 | |
| 101000 | |
| 100100 | |
| 000101 | |
| 001100 | |
| 001001 | |
| 010001 | |
| 100001 | |
| 010100 | |
| other | false |

(In one embodiment of the system, a "true" value corresponds to a voltage of $v_{cc}$, while a "false" value corresponds to a voltage of 0. Other embodiments may implement the flags using a different scheme.)

Second decoder 32 is configured to detect patterns in bits [0 . . . 5] which indicate that the decoded data will be valid if the running disparity is negative and invalid if the running disparity is positive. The values of the flag generated by second decoder 32 are shown in Table 3. It can be seen in this table that all of the bit patterns for which the flag generated by second decoder 32 is true contain four 1's and two 0's. It can also be seen that the bit patterns for which this flag is true are the bitwise inverse of the bit patterns for which the flag generated by first decoder 31 are true.

TABLE 3

| If [0 ... 5] = | The second flag is: |
|---|---|
| 100111 | true |
| 011101 | |
| 101101 | |
| 110101 | |
| 111001 | |
| 010111 | |
| 011011 | |
| 111010 | |
| 110011 | |
| 110110 | |
| 101110 | |
| 011110 | |
| 101011 | |
| Other | false |

Third decoder 33 is configured to detect patterns in bits [0 ... 5] which indicate that the decoded data will be the same, regardless of whether the running disparity is positive or negative. The values of the flag generated by third decoder 33 corresponding to each of the possible patterns of bits [0 ... 5] are shown in Table 4. It can be seen from this table that all of the bit patterns for which the value of the flag is true include three 1's and three 0's. (Because these bit patterns have equal numbers 1's and 0's, they have a neutral effect on RD (in the absence of code violations,) which represents the difference between the numbers of 1's and 0's previously transmitted.)

TABLE 4

| If [0 ... 5] = | The third flag is: |
|---|---|
| 110001 | true |
| 101001 | |
| 011001 | |
| 111000 | |
| 000111 | |
| 100101 | |
| 010101 | |
| 110100 | |
| 001101 | |
| 101100 | |
| 011100 | |
| 100011 | |
| 010011 | |
| 110010 | |
| 001011 | |
| 101010 | |
| 011010 | |
| 100110 | |
| 010110 | |
| 001110 | |
| Other | false |

Neutral decoder 34 is configured to detect patterns of bits [0 ... 5] which are neutral with respect to their effect on the running disparity. In other words, bit patterns for which the flag generated by a neutral decoder 34 is true and do not cause the running disparity to change subsequent to decoding the current encoded data word (in the absence of code violations.) Table 5 shows the values of this flag corresponding to the possible patterns for bits [0 ... 5].

TABLE 5

| If [0 ... 5] = | The neutral flag is: |
|---|---|
| 000111 | True |
| 001011 | |
| 001101 | |
| 001110 | |
| 010011 | |
| 010101 | |
| 010110 | |
| 011001 | |
| 011010 | |
| 011100 | |
| 100011 | |
| 100101 | |
| 100110 | |
| 101001 | |
| 101010 | |
| 101100 | |
| 110001 | |
| 110010 | |
| 110100 | |
| 111000 | |
| other | False |

Kn.7 decoder 35 is configured to detect patterns of bits [6 ... 9] which indicate that the encoded data word is a "K" character. These characters are special-characters purpose characters which are provided within the 8B/10B encoding scheme. Kn.7 decoder 35 generates two flags—one which is true for special characters with negative running disparity ("kn7_minus"), and one which is true for special characters with positive running disparity ("kn7_plus"). The values of these flags for various patterns of bits [6 ... 9] are shown in Table 6.

TABLE 6

| If [6 ... 9] = | the kn7_minus flag is: | the kn7_plus flag is: |
|---|---|---|
| 1000 | True | False |
| 0111 | False | True |
| other | False | False |

Decoder 12 comprises a pair of decoders 36 and 37, as well as a running disparity circuit 38. Decoders 36 and 37 accept as inputs portions of the encoded data words and the corresponding flags generated by pre-decoder 11, as well as the running disparity. In decoders 36 and 37 then generate the 8-bit data word corresponding to the encoded 10-bit data word. Running disparity circuit 38 maintains the value of the running disparity, as modified by the decoding of each successive data word, for use by decoders 36 and 37.

Decoder 36 receives the first, second and third flags from the first, second and third decoders, respectively. Decoder 36 also receives the running disparity from running disparity circuit 38 and bits [6 ... 9] from the input line 42. (As mentioned above, the pre-decode stage is separated from the decode stage by a plurality of flip-flops, so each of the values received by decoder 36 is actually received from one of these flip-flops.) decoder 36 processes this data and generates bits [5 ... 7] of the decoded data word. Because the flags and the running disparity each comprise a single bit, the processing of this data, along with the four bits [6 ... 9] requires only an 8-bit-wide logic block.

The output of decoder 36 is shown in Table 7, which lists the possible inputs to the decoder and the corresponding outputs. For the sake of clarity, some of the vertically adjacent cells in Table 7 have been consolidated into single cells. These consolidated cells correspond to each of the horizontal rows to which they are adjacent. The values of the flags which are input to decoder 36 are listed as either "T" (true), "F" (false). In the case of running disparity, "T" is equivalent to positive running disparity, while "F" is equivalent to negative running disparity. If no value is shown (i.e., the cell is empty,) the value of the respective flag (or running disparity) may be either true or false (positive or negative.)

TABLE 7

| If [6 . . . 9] =, and | RD = | first flag = | second flag = | third flag = | then [5 . . . 7] = |
|---|---|---|---|---|---|
| 0100 | F | T | | | 000 |
| | T | | | T | |
| 1011 | T | | T | | |
| | F | | | T | |
| 1001 | F | T | | | 001 |
| | T | | T | | |
| | | | | T | |
| | F | F | F | F | |
| 0110 | T | F | F | F | |
| 0101 | | T | | | 010 |
| | | | | T | |
| | | | | T | |
| | F | F | F | F | |
| 1010 | T | F | F | F | |
| 0011 | F | | | F | 011 |
| | T | | | T | |
| 1100 | T | | | F | |
| | F | | | T | |
| 0010 | F | | | F | 100 |
| | T | | | T | |
| 1101 | T | | | F | |
| | F | | | T | |
| 1010 | | T | | | 101 |
| | | | T | | |
| | | | | T | |
| | F | F | F | F | |
| 0101 | T | F | F | F | |
| 0110 | | T | | | 110 |
| | | | T | | |
| | | | | T | |
| | F | F | F | F | |
| 1001 | T | F | F | F | |
| 0001 | F | T | | F | 111 |
| | T | | | T | |
| 1110 | T | | T | F | |
| | F | | | T | |
| 1000 | F | | | | |
| | T | | | T | |
| 0111 | T | | | | |
| | F | | | T | |
| | Other | | | | Error |

Decoder 37 receives the kn7_plus and kn7_minus flags from Kn.7 decoder 35, the running disparity from the running disparity circuit 38, and bits [0 . . . 5] from the input line 41. From these inputs, decoder 37 generates bits [0 . . . 4] of the decoded 8-bit data word. These bits can then be combined with the output of decoder 36 (i.e., bits [5 . . . 7]) to form of the decoded 8-bit data word. The output of decoder 37 is shown in Table 8. This table shows the input bit patterns and flag values, and the corresponding decoded bits [0 . . .4].

TABLE 8

| If [0 . . . 5] =, and | RD = | Kn.7 − flag = | Kn.7 + flag = | then [0 . . . 4] = |
|---|---|---|---|---|
| 100111 | F | F | | 00000 |
| 011000 | T | | F | |
| 011101 | F | F | | 00001 |
| 100010 | T | | F | |
| 101101 | F | | F | 00010 |

TABLE 8-continued

| If [0 . . . 5] =, and | RD = | Kn.7 − flag = | Kn.7 + flag = | then [0 . . . 4] = |
|---|---|---|---|---|
| 010010 | T | | F | |
| 110001 | | F | F | 00011 |
| 110101 | F | F | | 00100 |
| 001010 | T | | F | |
| 101001 | | F | F | 00101 |
| 011001 | | F | F | 00110 |
| 111000 | F | F | | 00111 |
| 000111 | T | | F | |
| 111001 | F | F | | 01000 |
| 000110 | T | | F | |
| 100101 | | F | F | 01001 |
| 010101 | | F | F | 01010 |
| 110100 | | F | F | 01011 |
| | T | T | | |
| 001101 | | F | F | 01100 |
| 101100 | | F | F | |
| | T | T | | 01101 |
| 011100 | | F | F | 01110 |
| | T | T | | |
| 010111 | F | F | | 01111 |
| 101000 | T | | F | |
| 011011 | F | F | | 10000 |
| 100100 | T | | F | |
| 100011 | | F | F | 10001 |
| | F | | T | |
| 010011 | | F | F | 10010 |
| | F | | T | |
| 110010 | | F | F | 10011 |
| 001011 | | F | F | 10100 |
| | F | | T | |
| 101010 | | F | F | 10101 |
| 011010 | | F | F | 10110 |
| 111010 | F | | | 10111 |
| 000101 | T | | | |
| 110011 | F | F | | 11000 |
| 001100 | T | | F | |
| 100110 | | F | F | 11001 |
| 010110 | | F | F | 11010 |
| 110110 | F | | | 11011 |
| 001001 | T | | | |
| 001110 | | F | F | 11100 |
| 101110 | F | | | 11101 |
| 010001 | T | | | |
| 011110 | F | | | 11110 |
| 100001 | T | | | |
| 101011 | | F | F | 11111 |
| 010100 | T | | F | |
| 001111 | F | | | 11100 |
| 110000 | T | | | |
| Other | | | | Error |

Although not explicitly depicted in FIG. 2, it should be noted that each of decoders 36 and 37 is configured to generate an error signal in addition to their respective output bits of the decoded data words. The error signal of each decoder is asserted if the decoder detects an invalid bit pattern. This is represented by the last row of each of Tables 7 and 8. In one embodiment, decoders 36 and 37 are also configured to generate various signals indicative of ("K") characters.

Running disparity circuit 38 is configured to receive bits [6 . . . 9], the neutral flag generated by neutral decoder 34, and a COMMAQB signal. COMMAQB is a decode of the 10-bit pattern "001111xxxx" (RD-sync characters.) Based upon these inputs, running disparity circuit 38 is configured to determine whether or not to toggle the running disparity. The output of running disparity circuit 38 is shown in Table 9. (It should be noted that the running disparity is made positive if COMMAQB is true and current disparity is also true, correcting disparity to match incoming characters. The running disparity which is output by running disparity circuit 38 is provided to decoders 36 and 37 for use in decoding their respective portions of the decoded data words.

TABLE 9

(the expression (current disparity and commaqb) is false . . .)

| If [6 . . . 9] =, and | Current disparity = | Neutral flag = | then RD is toggled |
|---|---|---|---|
| 1011 | F | | True |
| 0100 | T | | |
| 1001 | | F | |
| 0101 | | F | |
| 0011 | F | | |
| 1100 | T | | |
| 1101 | F | | |
| 0010 | T | | |
| 1010 | | F | |
| 0110 | | F | |
| 0001 | T | | |
| 0111 | F | | |
| 1000 | T | | |

The foregoing description of FIG. 2 focuses upon a system that performs decoding of 8B/10B data. Another aspect of the present system and method concerns the encoding of 8-bit data into 10-bit data. Although somewhat less complex than the decoding aspect of the invention, the encoding of 8B/10B data is also contemplated to be within the scope of this disclosure.

Figure 3:
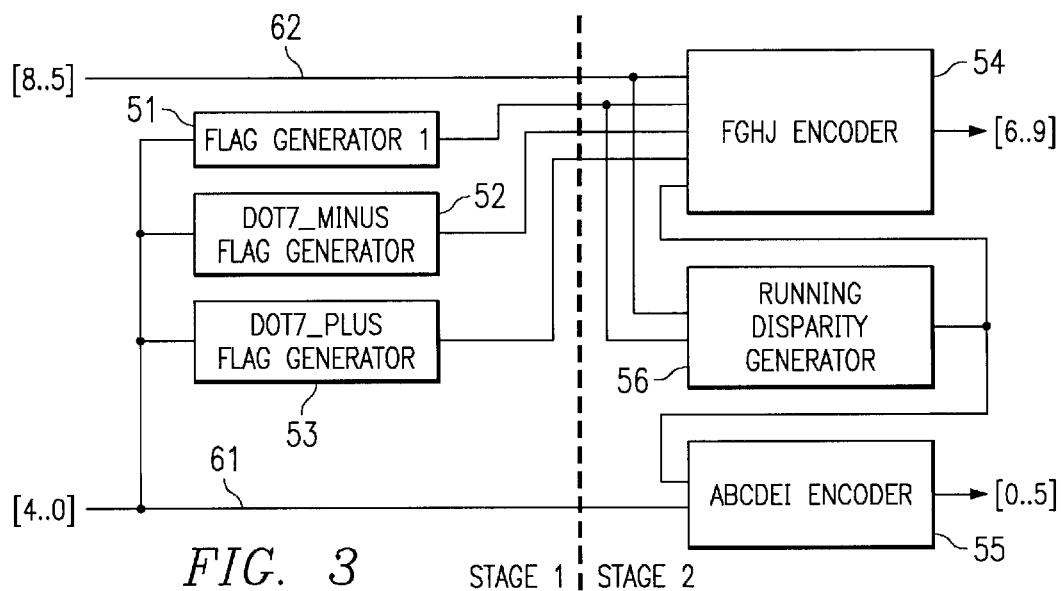
FIG. 3 is a functional block diagram illustrating one embodiment of the present 8B/10B encoding system.

Referring to FIG. 3, a functional block diagram illustrating another embodiment of the present system is shown. In this embodiment, data words that include eight bits and a K bit (which indicates whether the corresponding words a special character) are encoded into 10-bit data words. While the encoding system shown in FIG. 3 is somewhat less complex than the decoding system shown in FIG. 2, the system is organized in much the same way. That is, it comprises several components which form a pre-encode stage and several others which form an encode stage. Although not shown in the figure, a plurality of flip-flops are used to hold the data values and flags generated by the pre-encode stage for use by the encode stage. These flip-flops are located at the points at which the data/flag lines are intersected by the dashed line in the figure.

The first stage of the encoder consists of flag generators 51, 52 and 53. Each of these flying generators is coupled to input line 61 to receive bits [4 . . . 0] of the un-encoded data word and to produce a corresponding encoding flag. Flag generator 51 produces an encoding flag that indicates whether the running disparity will be affected by the encoding of the data. This flag is roughly complementary to the flags produced by decoder 33 shown in FIG. 2. That is, both flags to relate to whether the conversion of the data words between 8 bits and 10 bits depends upon the running disparity. Flag generators 52 and 53 produce encoding flags that indicate whether the data word being encoded is a special character (i.e., a "Kn.7" character.) All three of these encoding flags are input to encoder 54. The values of the encoding flags generated by flight generators 51, 52 and 53 are shown in tables 10, 11 and 12, respectively.

TABLE 10

| If [4 . . . 0] = | Flag 1 is: |
|---|---|
| 00011 | True |
| 00101 | |
| 00110 | |
| 00111 | |
| 01001 | |
| 01010 | |
| 01011 | |
| 01100 | |
| 01101 | |
| 10001 | |
| 10010 | |
| 10011 | |
| 10100 | |
| 10101 | |
| 10110 | |
| 11001 | |
| 11010 | |
| 11100 | |
| Other | False |

TABLE 11

| If [4 . . . 0] = | the dot7_minus flag is: |
|---|---|
| 10001 | True |
| 10010 | |
| 10100 | |
| Other | False |

TABLE 12

| If [4 . . . 0] = | The dot7_plus flag is: |
|---|---|
| 01011 | True |
| 01101 | |
| 01110 | |
| Other | False |

The second stage of the encoder shown in FIG. 2 comprises encoders 54 and 55, as well as running disparity generator 56. Encoder 54 receives as inputs bits [8 . . . 5] of the 8-bit data word, the three encoding flags generated by flag generators 51, 52 and 53, and the running disparity output by running disparity generator 56. Based upon these inputs, encoder 54 generates bits [6 . . . 9] of the encoded 10-bit data word. Table 13 shows the output of encoder 54 for various possible inputs.

TABLE 13

| If [8 . . . 5] =, and | RD = | flag 1 = | Dot7_minus flag = | Dot7_plus flag = | then [6 . . . 9] = |
|---|---|---|---|---|---|
| 0000 | F | F | | | 0100 |
| | T | T | | | |
| | F | T | | | 1011 |
| | T | F | | | |
| 0001 | | | | | 1001 |
| 0010 | | | | | 0101 |
| 0011 | F | F | | | 1100 |
| | T | T | | | |
| | F | T | | | 0011 |
| | T | F | | | |

TABLE 13-continued

| If [8 ... 5] =, and | RD = | flag 1 = | Dot7_minus flag = | Dot7_plus flag = | then [6 ... 9] = |
|---|---|---|---|---|---|
| 0100 | F | F | | | 0010 |
| | T | T | | | |
| | F | T | | | 1101 |
| | T | F | | | |
| 0101 | | | | | 1010 |
| 0110 | | | | | 0110 |
| 0111 | F | F | | | 0001 |
| | T | T | | F | |
| | F | T | F | | 1110 |
| | T | F | | | |
| | F | T | T | | 0111 |
| | T | t | T | | 1000 |
| 1000 | F | | | | 0100 |
| | T | | | | 1011 |
| 1001 | F | | | | 1001 |
| | T | | | | 0110 |
| 1010 | F | | | | 0101 |
| | T | | | | 1010 |
| 1011 | F | | | | 0011 |
| | T | | | | 1100 |
| 1100 | F | | | | 0010 |
| | T | | | | 1101 |
| 1101 | F | | | | 1010 |
| | T | | | | 0101 |
| 1110 | F | | | | 0110 |
| | T | | | | 1001 |
| 1111 | F | | | | 1000 |
| | T | | | | 0111 |
| Other | | | | | 1001 |

Encoder 55 does not require any of the encoding flags as inputs in order to generate the remainder of the encoded data word. Inputs to encoder 55 consist bits [4 ... 0] of the unencoded 8-bit data word and the running disparity. Encoder 55 generates bits [0 ... 5] of the encoded 10-bit data word from these inputs. The output bits that are generated by encoder 55 based upon the running disparity and bits [4 ... 0] are shown in table 14.

TABLE 14

| If [4 ... 0] =, and | RD = | K = | then [0 ... 5] = |
|---|---|---|---|
| 00000 | F | F | 100111 |
| | T | F | 011000 |
| 00001 | F | F | 011101 |
| | T | F | 100010 |
| 00010 | F | F | 101101 |
| | T | F | 010010 |
| 00011 | | f | 110001 |
| 00100 | F | F | 110101 |
| | T | F | 001010 |
| 00101 | | F | 101001 |
| 00110 | | F | 011001 |
| 00111 | F | F | 111000 |
| | T | F | 000111 |
| 01000 | F | F | 111001 |
| | T | F | 000110 |
| 01001 | | F | 100101 |
| 01010 | | F | 010101 |
| 01011 | | F | 110100 |
| 01100 | | F | 001101 |
| 01101 | | F | 101100 |
| 01110 | | F | 011100 |
| 01111 | F | F | 010111 |
| | T | F | 101000 |
| 10000 | F | F | 011011 |
| | T | F | 100100 |
| 10001 | | F | 100011 |
| 10010 | | F | 010011 |
| 10011 | | F | 110010 |
| 10100 | | F | 001011 |

TABLE 14-continued

| If [4 ... 0] =, and | RD = | K = | then [0 ... 5] = |
|---|---|---|---|
| 10101 | | F | 101010 |
| 10110 | | F | 011010 |
| 10111 | F | F | 111010 |
| | T | F | 000101 |
| 11000 | F | F | 110011 |
| | T | F | 001100 |
| 11001 | | F | 100110 |
| 11010 | | F | 010110 |
| 11011 | F | F | 110110 |
| | T | F | 001001 |
| 11100 | | F | 001110 |
| 11101 | F | F | 101110 |
| | T | F | 010001 |
| 11110 | F | F | 011110 |
| | T | F | 100001 |
| 11111 | F | F | 101011 |
| | T | F | 010100 |
| 11100 | | T | 001111 |
| | | | 110000 |
| | | | 111010 |
| | | | 000101 |
| | | | 110110 |
| | | | 001001 |
| | | | 101110 |
| | | | 010001 |
| | | | 011110 |
| | | | 100001* |
| Other | | | 010101 |

*depending upon the applicable special character

Running disparity generator 56 produces running disparity as an output. This output is conveyed to the inputs of encoders 54 and 55 for use in encoding their respective portions of the 8-bit data word. The running disparity is generated based upon bits [8 ... 5] of the unencoded data word and the encoding flag generated by flag generator 51. The output of running disparity generator 56 is shown in table 15.

TABLE 15

| If [4 ... 0] | and flag 1 = | RD toggled |
|---|---|---|
| 0000 | T | True |
| 0001 | F | |
| 0010 | F | |
| 0011 | F | |
| 0100 | T | |
| 0101 | F | |
| 0110 | F | |
| 0111 | T | |
| 1001 | | |
| 1010 | | |
| 1011 | | |
| 1101 | | |
| 1110 | | |
| 1111 | | |
| Other | | False |

As noted above, the encoder shown in FIG. 3 has both a pre-encode stage and an encode stage. These stages are independent of each other in that the operation of the first stage is not depend upon the output of the second stage. (The flag generators contained in the first stage half as inputs only bits [4 ... 0] of the unencoded 8-bit word.) Consequently, after the first stage operates on a particular data word (i.e., generates encoding flags corresponding to data word,) it may proceed to operate on a subsequent data word while the second stage operates on the first data word. Put another way, the two stages of the encoder can be pipelined. This system can therefore encode an 8-bit data word in each clock cycle, whereas conventional encoders required to clock cycles per word. (This is true because conventional encoders encode a first portion of the data word, then update the running disparity, then encode the remaining portion of the data word.)

It should be noted that a system which includes both encoding and decoding functions as described above may be constructed. In one embodiment, encoded data may be received by a device that employs the decoding/encoding system. The data is first decoded by the decoding subsystem, and is then passed to the device for processing. After the decoded data is processed by the device, the data (or data that is generated by the device) is encoded by the encoding sub-system and transmitted to another device.

While the present invention has been described with reference to particular embodiments, it should be understood that the embodiments are illustrative and that the scope of the invention is not limited to these embodiments. Many variations, modifications, additions and improvements to the embodiments described above are possible. It is contemplated that these variations, modifications, additions and improvements fall within the scope of the invention as detailed within the following claims.

What is claimed is:

1. A decoder for 8B/10B encoded data comprising:
    a pre-decoder configured to identify patterns in an encoded data word and to set one or more flags corresponding to the identified patterns; and
    a decoder configured to receive the encoded data word and the corresponding one or more flags and to decode the encoded data word based upon the corresponding one or more flags.

2. The decoder of claim 1 wherein the decoder comprises a pair of limited-width logic blocks, wherein each of the logic blocks is configured to receive a portion of the encoded data word and at least one of the corresponding one or more flags, wherein the aggregate data width of the portion of the encoded data word and the at least one of the corresponding one or more flags is no larger than the data width of the logic block.

3. The decoder of claim 2 wherein each logic block concurrently decodes the corresponding portion of the encoded data word.

4. The decoder of claim 1 wherein the decoder comprises a pair of logic blocks, wherein each of the logic blocks is configured to receive a portion of the encoded data word and at least one of the corresponding one or more flags, wherein each logic block concurrently decodes the corresponding portion of the encoded data word.

5. The decoder of claim 4 wherein the aggregate data width of the portion of the encoded data word and the at least one of the corresponding one or more flags is no larger than the data width of the logic block.

6. The decoder of claim 1 wherein the decoder is configured to decode a first encoded data word concurrently with the pre-decoder pre-decoding a subsequent encoded data word.

7. The decoder of claim 1 further comprising a running disparity circuit configured to receive a portion of the encoded data word and to generate a running disparity value which is input to the decoder.

8. The decoder of claim 7 wherein the pre-decoder comprises: a first flag generator configured to determine whether a pre-decoded portion of the encoded data word will be decoded to the same value regardless of the running disparity value; a second first flag generator configured to determine whether a pre-decoded portion of the encoded data word will be decoded to a valid value if the running disparity value is positive; and a third flag generator configured to determine whether a pre-decoded portion of the encoded data word will be decoded to a valid value if the running disparity value is negative.

9. A method for decoding 8B/10B encoded data using limited-width logic blocks, comprising:
    receiving an encoded data word, wherein the encoded data word includes a first portion and a second portion;
    predecoding the first portion of the encoded data word to produce a first plurality of flags, wherein the aggregate number of bits in the first plurality of flags is less than the number of bits in the first portion of the encoded data word;
    decoding in a first logic block a first set of bits including the first plurality of flags and the second portion of the encoded data word to produce a second portion of a decoded data word;
    decoding in a second logic block a second set of bits including the first portion of the encoded data word to produce a first portion of the decoded data word; and
    combining the first and second portions of the decoded data word.

10. The method of claim 9 wherein the first and second logic blocks are eight bits wide.

11. The method of claim 10 wherein the first portion of the encoded data word comprises bits [0 . . . 5] of the encoded data word and the second portion of the encoded data word comprises bits [6 . . . 9] of the encoded data word and wherein the first plurality of flags comprise three bits.

12. The method of claim 9 further comprising predecoding the second portion of the encoded data word to produce a second plurality of flags, wherein the aggregate number of bits in the second plurality of flags is less than the number of bits in the second portion of the encoded data word, wherein the second set of bits includes the second plurality of flags.

13. The method of claim 9 wherein the decoding of the first set of bits and the decoding of the second set of bits are performed concurrently.

14. A method for decoding 8B/10B encoded data words, comprising:
    pre-decoding at least a part of a encoded data word;
    generating one or more flags based upon the pre-decoding of the encoded data word; and
    decoding the encoded data word based upon the one or more flags.

15. The method of claim 14 wherein decoding the encoded data word comprises concurrently decoding first and second portions of the encoded data word.

16. The method of claim 14 wherein decoding the encoded data word is performed concurrently with the pre-decoding of a subsequent encoded data word and wherein the pre-decoding of the encoded data word is performed concurrently with the decoding of a preceding encoded data word.

17. The method of claim 16 wherein pre-decoding the first encoded data word comprises identifying one or more bit patterns in the first encoded data word and setting one or more flags corresponding to the one or more identified bit patterns.

18. The method of claim 17 wherein the pre-decoding of the first encoded data word is performed in a first clock cycle and wherein the decoding of the first encoded data word is performed in a second clock cycle.

19. A system for decoding and encoding 8B/10B data comprising:

a decoding subsystem, wherein the decoding subsystem includes
  a pre-decoder configured to identify patterns in an encoded data word and to set one or more decoding flags corresponding to the identified patterns
  a decoder configured to receive the encoded data word and the corresponding one or more decoding flags and to decode the encoded data word based upon the corresponding one or more decoding flags; and
an encoding subsystem, wherein the encoding subsystem includes
  a pre-encoder configured to identify patterns in an unencoded data word and to set one or more encoding flags corresponding to the identified patterns and
  an encoder configured to receive the unencoded data word and the corresponding one or more encoding flags and to encode the unencoded data word based upon the corresponding one or more encoding flags.

20. The system of claim 19 wherein the decoding subsystem comprises a pair of logic blocks which are configured to concurrently decode first and second portions of the encoded data word, and wherein the encoding subsystem comprises a pair of logic blocks which are configured to concurrently encode first and second portions of the unencoded data word.

21. The system of claim 19 wherein the decoder is configured to decode a first encoded data word concurrently with the pre-decoder pre-decoding a subsequent encoded data word, and wherein the encoder is configured to encode a first unencoded data word concurrently with the pre-encoder pre-encoding a subsequent unencoded data word.

22. An encoder for 8B/10B data comprising:
  a pre-encoder configured to identify patterns in an unencoded data word and to set one or more encoding flags corresponding to the identified patterns; and
  an encoder configured to receive the unencoded data word and the corresponding one or more encoding flags and to encode the unencoded data word based upon the corresponding one or more encoding flags.

23. The encoder of claim 22 wherein the encoding subsystem comprises a pair of logic blocks which are configured to concurrently encode first and second portions of the unencoded data word.

24. The encoder of claim 22 wherein the encoder is configured to encode a first unencoded data word concurrently with the pre-encoder pre-encoding a subsequent unencoded data word.

25. A method for encoding 8B/10B data words, comprising:
  pre-encoding at least a part of an unencoded data word;
  generating one or more flags based upon the pre-encoding of the unencoded data word; and
  encoding the unencoded data word based upon the one or more flags.

26. The method of claim 25 wherein encoding the unencoded data word comprises concurrently encoding first and second portions of the unencoded data word.

27. The method of claim 25 wherein encoding the unencoded data word is performed concurrently with the pre-encoding of a subsequent unencoded data word and wherein the pre-encoding of the unencoded data word is performed concurrently with the encoding of a preceding unencoded data word.

* * * * *